United States Patent
Lin et al.

(10) Patent No.: US 7,209,062 B1
(45) Date of Patent: Apr. 24, 2007

(54) APPARATUS AND METHOD FOR GAIN ADJUSTMENT FOR ANALOG YPBPR SIGNALS

(75) Inventors: Yue-Zen Lin, Hsinchu (TW); Chui-Hsun Chiu, Taoyuan County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 11/308,752

(22) Filed: Apr. 28, 2006

(30) Foreign Application Priority Data

Feb. 22, 2006 (TW) .............................. 95105883 A

(51) Int. Cl.
*H03M 1/62* (2006.01)
(52) U.S. Cl. .................. 341/139; 341/120; 341/155
(58) Field of Classification Search ............. 341/120, 341/132, 139, 140, 155; 345/74.1, 75.2, 345/75.1, 69, 690, 691
See application file for complete search history.

(56) References Cited

U.S. PATENT DOCUMENTS

| 6,873,308 | B2 * | 3/2005 | Sagano et al. | 345/75.2 |
| 6,985,141 | B2 * | 1/2006 | Abe et al. | 345/204 |
| 7,030,867 | B2 * | 4/2006 | Takeuchi | 345/204 |
| 2006/0038836 | A1 * | 2/2006 | Abe et al. | 345/690 |
| 2006/0077087 | A1 * | 4/2006 | Moore et al. | 341/155 |

* cited by examiner

*Primary Examiner*—Linh V. Nguyen
(74) *Attorney, Agent, or Firm*—Jianq Chyun IP Office

(57) ABSTRACT

An apparatus and a method for gain adjustment for analog YPbPr signals are provided. The apparatus comprises a first clamping circuit, an analog-to-digital converter (ADC), and a gain calculator. The first clamping circuit clamps the lowest potential of a horizontal synchronization signal of a Y signal of an analog YPbPr signal to 0 V. The ADC converts the clamped Y signal from an analog signal to a digital signal and then outputs the digital signal. The gain calculator receives the actual peak-to-peak voltage of the horizontal synchronization signal from the ADC, and then calculates and sets the gain for the ADC according to the peak-to-peak voltage.

22 Claims, 2 Drawing Sheets

Gain adjustment stage

Normal operation stage

APPARATUS AND METHOD FOR GAIN ADJUSTMENT FOR ANALOG YPBPR SIGNALS

CROSS-REFERENCE TO RELATED APPLICATION

This application claims the priority benefit of Taiwan application serial no. 95105883, filed on Feb. 22, 2006. All disclosure of the Taiwan application is incorporated herein by reference.

BACKGROUND OF THE INVENTION

1. Field of Invention

The present invention relates to an apparatus and method for gain adjustment for analog YPbPr signals, and more particularly, to an apparatus and method for gain adjustment for analog YPbPr signals for high definition television (HDTV).

2. Description of Related Art

The front end system of the HDTV generally utilizes an analog-to-digital converter (ADC) to convert analog YPbPr input signals. The analog YPbPr input signal is often attenuated or amplified due to environmental factors, so the digitalized signal cannot extend to the maximum output range of the ADC, or exceeds it and becomes saturated. As a result, the contrast of the displayed frames is adversely affected. For example, under the circumstance that the maximum output range of the ADC is 00h-7Fh, the analog YPbPR input signal might only be converted to the range of 00h-5Fh due to attenuation, thus the frames are relatively dim. Alternatively, due to amplification, the analog signal might only be converted to the range of 00h-9Fh, thus resulting in output saturation.

In order to solve this problem, after the outputting of the ADC, a digital signal process is carried out in the conventional method, and then the digitalized YPbPr signal is adjusted, so that the digitalized YPbPr signal can cover the whole output range of the ADC. However, the conventional digital signal processing has many disadvantages.

As for the conventional method, data must be collected and histograms must be made, so as to determine the distribution of the digital signal. Since the process is relatively long and complicated, it is time consuming and imposes heavy burden on the system. In order to balance the quality and the cost, bandwidth and resolution are inevitably compromised. In addition, the signal range is non-linearly scaled in the conventional method, such that the image quality is negatively affected.

SUMMARY OF THE INVENTION

An object of the present invention is to provide an apparatus for gain adjustment for the analog YPbPr signal, suitable for being applied to HDTV or other fields, wherein the contrast value of the analog YPbPr signal is improved by the gain adjustment mechanism built-in in the ADC, so as to avoid many disadvantages of the conventional art.

Another object of the present invention is to provide a method for gain adjustment for the analog YPbPr signal, suitable for being applied to HDTV or other fields. Compared with the conventional method, the burden on the system of processing digital signals is relieved, and the time consumed by image processing is reduced.

In order to achieve the above and other objects, the present invention provides an apparatus for gain adjustment for the analog YPbPr signal, which comprises a first clamping circuit, an ADC, and a gain calculator. The first clamping circuit clamps the lowest potential of a horizontal synchronization signal of a Y signal of an analog YPbPr to 0 V. The ADC converts the clamped Y signal from an analog signal to a digital signal, and outputs the digital signal. The gain calculator receives the actual peak-to-peak voltage of the horizontal synchronization signal from the ADC, and then calculates and sets a gain for the ADC according to the actual peak-to-peak voltage of the horizontal synchronization signal.

As for the apparatus for gain adjustment for the analog YPbPr signal, in an embodiment, the first clamping circuit clamps the horizontal synchronization signal at the first falling edge of the horizontal synchronization signal.

As for the apparatus for gain adjustment for the analog YPbPr signal, in an embodiment, the ADC receives the gain with a register contained in the ADC.

As for the apparatus for gain adjustment for the analog YPbPr signal, in an embodiment, $M=A+B*(G/2R)$, wherein M is an input voltage corresponding to the maximum output of the ADC, A and B are predetermined voltages, G is the gain, and R is the number of bits of the ADC.

As for the apparatus for gain adjustment for the analog YPbPr signal, in an embodiment, the gain $G=((VD/VS)*X-A)/B*2R$, wherein VD is a standard peak-to-peak voltage of a data signal of the Y signal, VS is a standard peak-to-peak voltage of the horizontal synchronization signal of the Y signal, and X is the actual peak-to-peak voltage of the horizontal synchronization signal.

The apparatus for gain adjustment for the analog YPbPr signal further comprises a sync slicer in an embodiment. The sync slicer generates a compound synchronization signal according to the Y signal. If the Y signal is greater than a reference voltage, the compound synchronization signal is at a first state. If the Y signal is smaller than the reference voltage, the compound synchronization signal is at a second state. The gain calculator begins to calculate and set the gain for the ADC at the second edge of the compound synchronization signal.

The apparatus for gain adjustment for the analog YPbPr signal further comprises a phase locked loop (PLL) in an embodiment, which is used to generate a pixel clock signal according to a first edge of the compound synchronization signal, and the pixel clock signal is used as the operation frequency for the ADC and the gain calculator.

The apparatus for gain adjustment for the analog YPbPr signal further comprises a second clamping circuit in an embodiment, which is used to clamp the Y signal to 0 V in a horizontal blanking period of the Y signal, and thereby the ADC receives the clamped Y signal.

From another point of view, the present invention further provides a method for gain adjustment for an analog YPbPr signal, suitable for calculating and setting the gain of an ADC. The ADC receives and converts the analog YPbPr signal. The method is characterized by calculating and setting the gain according to the actual peak-to-peak voltage of the horizontal synchronization signal of the Y signal of the analog YPbPr signal.

According to the preferred embodiment of the present invention, the apparatus and method for gain adjustment for an analog YPbPr signal utilizes the clamping circuit and the gain adjustment function built-in in the ADC to automatically adjust the gain of the front end ADC through simple mathematical calculations, such that the analog YPbPr input signal can cover the whole output range of the ADC after being converted to digital form. Compared with the conventional method for processing digital signals, the calculation process of the present invention is simple and time-saving, relieves the burden on the system, and shortens the time for image processing, without compromising the bandwidth and image resolution. The signal range is linearly scaled in the present invention, such that the image quality is not compromised.

In order to make aforementioned and other objects, features, and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
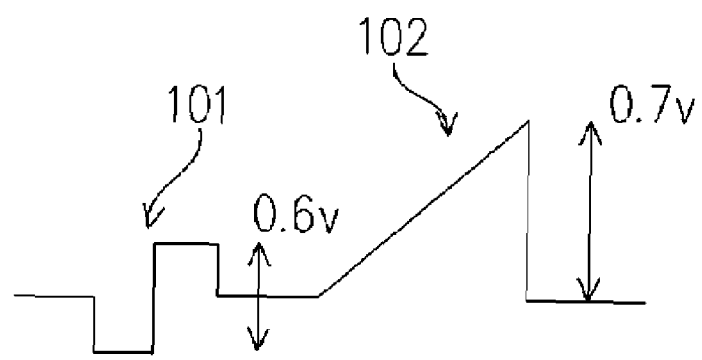
FIGS. 1A and 1B are schematic views of the Y signal in the analog YPbPr signal.
Figure 1B:
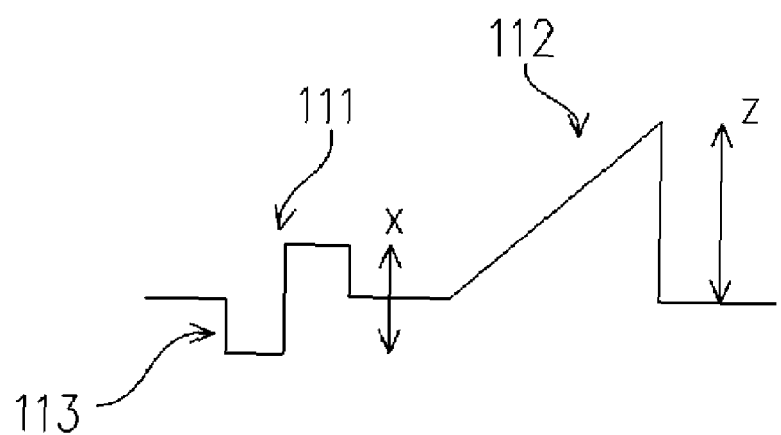

In the standard YPbPr signal, the Y signal shown in FIG. 1A indicates white level, and includes a horizontal synchronization signal 101 and a data signal 102. In the standard Y signal, the standard peak-to-peak voltage of the horizontal synchronization signal 101 is 0.6V, and the maximum peak-to-peak voltage of the data signal 102 is 0.7V, as shown in FIG. 1A. In actual application, the Y signal is inevitably attenuated or amplified due to being affected by the environment, as shown in FIG. 1B. At this time, the actual peak-to-peak voltage of the horizontal synchronization signal 111 is X, and the maximum peak-to-peak voltage of the data signal 112 is Z. The proportional relationship between X and Z is constant. That is, X/Z=0.6/0.7, and Z=X*0.7/0.6 is obtained after derivation. Therefore, the present invention provides an apparatus and method for adjusting the voltage of the data signal according to the horizontal synchronization signal, wherein as long as X is measured, the maximum peak-to-peak voltage of the data signal is obtained to be Z, and then the gain of the ADC is adjusted accordingly, such that the digitalized data signal corresponds to the whole output range of the ADC.

Figure 2:
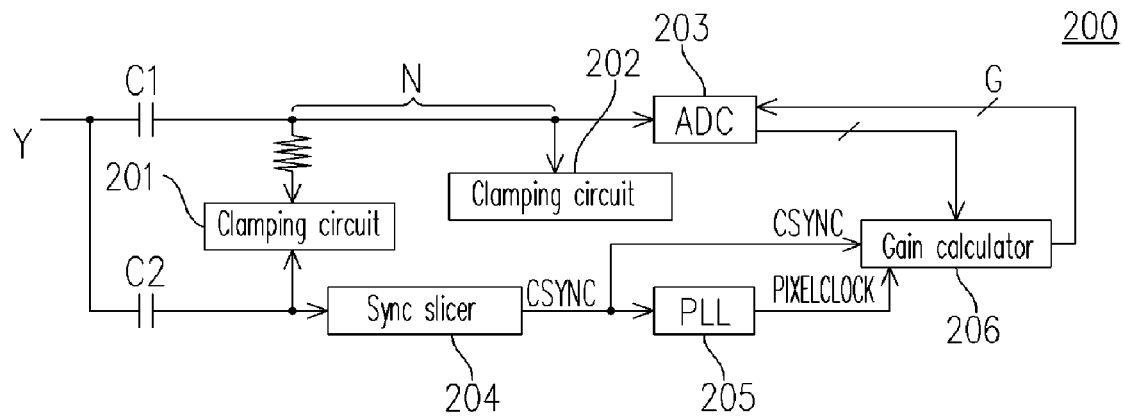
FIG. 2 is an architecture view of an apparatus for gain adjustment for the analog YPbPr signal according to an embodiment of the present invention.
Figure 3:
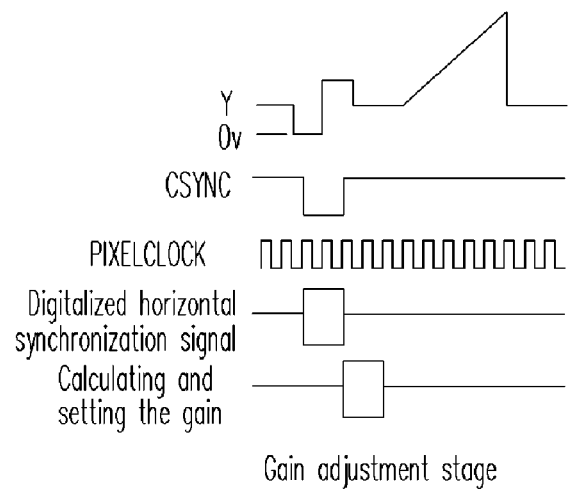
FIG. 3 is a timing chart of the signals of the apparatus for gain adjustment of FIG. 2.
Figure 3:
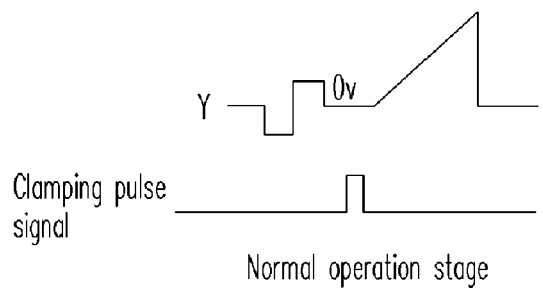

The following description is given below with reference to FIG. 1B, FIG. 2, and FIG. 3. FIG. 2 is an architecture view of an apparatus 200 for gain adjustment for the analog YPbPr signal according to an embodiment of the present invention. FIG. 3 is a timing chart of the signals of the apparatus 200 for gain adjustment. The apparatus 200 for gain adjustment for the analog YPbPr signal includes capacitors C1, C2, clamping circuits 201, 202, a sync slicer 204, a PLL 205, an ADC 203, and a gain calculator 206.

The capacitor C1 receives the input Y signal with the first end, and is coupled to the clamping circuit 201, 202 and the ADC 203 with the second end. The capacitor C2 receives the input Y signal with the first end, and is coupled to the clamping circuit 201 and the sync slicer 204 with the second end. The capacitors C1 and C2 are used to filter out the direct current (DC) component of the Y signal. If the Y signal does not contain a DC component, the capacitors C1 and C2 can be omitted.

As shown in FIG. 3, at the first falling edge 113 of the horizontal synchronization signal 111, the clamping circuit 201 clamps the lowest potential of the horizontal synchronization signal 111 to 0 V at the contact N of FIG. 2. The clamping action is used to enable the ADC 203 to output digitalized peak-to-peak voltage X.

The sync slicer 204 generates a compound synchronization signal CSYNC according to the Y signal by way of comparing the Y signal with a reference voltage, wherein if the Y signal is greater than the reference voltage, the compound synchronization signal CSYNC is logic 1, while if the Y signal is smaller than the reference voltage, the compound synchronization signal CSYNC is logic 0. Basically, as shown in FIG. 3, the CSYNC follows the polarity of the horizontal synchronization signal 111 and it is only slightly delayed after passing through the sync slicer 204.

After the compound synchronization signal CSYNC has been generated, the PLL 205 generates a pixel clock signal PIXELCLOCK according to the falling edge of the compound synchronization signal CSYNC. The pixel clock signal PIXELCLOCK serves as the operation frequency for the ADC 203 and the gain calculator 206. With the pixel clock signal PIXELCLOCK, the ADC 203 begins to convert the clamped Y signal from an analog signal to a digital signal, and then output the digital signal to the gain calculator 206. As shown in FIG. 3, the gain calculator 206 begins to receive the actual peak-to-peak voltage X of the horizontal synchronization signal 111 from the ADC 203 at the rising edge of the compound synchronization signal CSYNC, then calculates and sets the gain G of the ADC 203 according to the actual peak-to-peak voltage X. In this embodiment, the ADC 203 receives the setting of the gain G with a register contained in the ADC 203.

In other embodiments of the present invention, the states of logic 1, 0 of the compound synchronization signal CSYNC may be reversed, and meanwhile, the falling edge and the rising edge of the CSYNC are also alternated. The present invention can be easily modified by those of ordinary skill in the art, so as to be suitable for the reversed compound synchronization signal CSYNC.

Adjusting the gain G is to adjust the output range of the ADC 203. The ADC 203 of the present invention satisfies $M=A+B*(G/2R)$, wherein M is an input voltage corresponding to the maximum output value of the ADC 203, A and B are predetermined voltages, G is the gain, and R is the number of bits of the ADC 203. If the digitalized Y signal is intended to be extended to the maximum output range of the ADC 203, M must be equal to Z, and then according to proportional relationship $Z=X*0.7/0.6$ of FIGS. 1A and 1B, $G=((0.7/0.6)*X-A)/B*2R$ can be derived. Since the parameters A, B, and R related to ADC 203 are known, as long as the actual peak-to-peak voltage X of the horizontal synchronization signal 111 is measured, the gain G to be set is calculated by the gain calculator 206 according to X.

If the standard of Y signal is changed, only the calculation formula of gain G is required to be changed to $G=((VD/VS)*X-A)/B*2R$, wherein VD is the standard peak-to-peak voltage of the data signal of the Y signal and VS is the standard peak-to-peak voltage of the horizontal synchronization signal 111. In this embodiment, VD=0.7V, VS=0.6V, A=B=0.5V, and R=8.

After the gain G has been set, the apparatus 200 for gain adjustment enters into the normal operation stage from the gain adjustment stage. As shown in FIG. 3, the clamping circuit 202 clamps the Y signal of the contact N to 0 V at the horizontal blanking period of the Y signal according to the clamping pulse signal. After the action of zeroing, the ADC 203 begins to receive and convert the clamped Y signal. In order to make the clamped pulse signal fall in the correct horizontal blanking period, the position and the length of the clamping pulse signal are determined according to one or more of the horizontal synchronization signal 111, the compound synchronization signal CSYNC, and the pixel clock signal PIXELCLOCK.

The above process of gain adjustment is carried out for each scan line, i.e., the gain of each scan line is determined according to the horizontal synchronization signal of said scan line. After adjustment, no matter the input signal is attenuated or amplified, the result after digitalization can cover the whole output range of the ADC. If the input signals are relatively stable, the gain can be fixed after the first several scan lines of a frame have been adjusted.

In addition to the apparatus 200 for gain adjustment of the above embodiments, a method for gain adjustment for the analog YPbPr signal is further provided by the present invention. Similarly, this method is characterized by calculating and setting the gain of the ADC according to the actual peak-to-peak voltage of the horizontal synchronization signal of the Y signal in the analog YPbPr signal. In the method for adjustment, the ADC receives the gain with the register contained in the ADC. The ADC satisfies $M=A+B*(G/2R)$, wherein M is an input voltage corresponding to the maximum output value of the ADC, A and B are predetermined voltages, G is the gain, and R is the number of bits of the ADC. If the standard of Y signal is changed, the calculation formula of gain G is changed to $G=((VD/VS)*X-A)/B*2R$, wherein VD is the standard peak-to-peak voltage of the data signal of the Y signal, VS is the standard peak-to-peak voltage of the horizontal synchronization signal, and X is the actual peak-to-peak voltage of the horizontal synchronization signal.

Further, with this method for adjustment, the DC component of the Y signal also can be filtered out. In addition, the method of the present invention further comprises generating a compound synchronization signal according to the Y signal. If the Y signal is greater than a reference voltage, the compound synchronization signal is logic 1. If the Y signal is smaller than the reference voltage, the compound synchronization signal is logic 0. In the method of the present invention, the gain begins to be calculated and set at the rising edge of the compound synchronization signal. It can be easily appreciated by those skilled in the art that, in the method of the present invention, the logic state of the compound synchronization signal and the starting point of calculation can also be logically reversed to those described in the above embodiment.

Furthermore, the method for adjustment of the present invention further comprises clamping the lowest potential of the horizontal synchronization signal to 0 V, and then converting the clamped Y signal from an analog signal to a digital signal, and then calculating and setting the gain according to the digitalized actual peak-to-peak voltage. The step of clamping the lowest potential of the horizontal synchronization signal to 0 V is achieved at the first falling edge of the horizontal synchronization signal. The other technical details of this method have already been described in the above embodiments of the apparatus, and thus will not be described herein any more.

In summary, the apparatus and method for gain adjustment for the analog YPbPr signal employs the clamping circuit and the gain adjustment function built-in in the ADC to automatically adjust the gain for the front end ADC through simple mathematical calculations, such that the analog YPbPr input signal can cover the whole output range of the ADC after being converted to digital form. Compared with the conventional digital signal processing, the calculation process of the present invention is simple and time-saving, relieves the burden of the system, and shortens the time for image processing, without compromising the bandwidth and image resolution. The signal range is linearly scaled in the present invention, so the image quality is not compromised.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for gain adjustment for an analog YPbPr signal, comprising:
    a first clamping circuit for clamping the lowest potential of a horizontal synchronization signal of a Y signal of the analog YPbPr signal to 0 V;
    an analog-to-digital converter (ADC) for converting the clamped Y signal from an analog signal to a digital signal; and
    a gain calculator for receiving the digitized horizontal synchronization signal from the ADC, and then calculating and setting a gain of the ADC according to an actual horizontal synchronization peak-to-peak voltage of the digitized horizontal synchronization signal.

2. The apparatus for gain adjustment for the analog YPbPr signal as claimed in claim 1, wherein the first clamping circuit clamps the horizontal synchronization signal at a first falling edge of the horizontal synchronization signal.

3. The apparatus for gain adjustment for the analog YPbPr signal as claimed in claim 1, wherein the ADC receives the gain with a register contained within the ADC.

4. The apparatus for gain adjustment for the analog YPbPr signal as claimed in claim 1, wherein the ADC satisfies the relation of $M=A+B*(G/2^R)$, wherein M is an input voltage corresponding to the maximum output value of the ADC, A is a first predetermined voltage, B is a second predetermined voltage, G is the gain, and R is the number of bits of the ADC.

5. The apparatus for gain adjustment for the analog YPbPr signal as claimed in claim 4, wherein the gain $G=((VD/VS)*X-A)/B*2R$, wherein VD is a standard data peak-to-peak voltage of a data signal of the Y signal, VS is a standard horizontal synchronization peak-to-peak voltage of the horizontal synchronization signal of the Y signal, and X is the actual horizontal synchronization peak-to-peak voltage of the horizontal synchronization signal.

6. The apparatus for gain adjustment for the analog YPbPr signal as claimed in claim 1, further comprising:
    a first capacitor having a first end receiving the Y signal and a second end coupled to the first clamping circuit and the ADC; and
    a second capacitor having a first end receiving the Y signal and a second end coupled to the first clamping circuit.

7. The apparatus for gain adjustment for the analog YPbPr signal as claimed in claim 1, further comprising:
a sync slicer for generating a compound synchronization signal according to the Y signal, wherein if the Y signal is greater than a reference voltage, the compound synchronization signal is at a first state, if the Y signal is smaller than the reference voltage, the compound synchronization signal is at a second state, and the gain calculator begins to calculate and set the gain of the ADC at a second edge of the compound synchronization signal.

8. The apparatus for gain adjustment for the analog YPbPr signal as claimed in claim 7, further comprising:
a phase locked loop (PLL) for generating a pixel clock signal according to a first edge of the compound synchronization signal, wherein the pixel clock signal is used as the operation frequency for the ADC and the gain calculator.

9. The apparatus for gain adjustment for the analog YPbPr signal as claimed in claim 8, wherein the first state is logic 1, the second state is logic 0, the first edge is a falling edge, and the second edge is a rising edge.

10. The apparatus for gain adjustment for the analog YPbPr signal as claimed in claim 8, wherein the first state is logic 0, the second state is logic 1, the first edge is a rising edge, and the second edge is a falling edge.

11. The apparatus for gain adjustment for the analog YPbPr signal as claimed in claim 1, further comprising:
a second clamping circuit for clamping the Y signal to 0 V in a horizontal blanking period of the Y signal, wherein the ADC receives the clamped Y signal.

12. A method for gain adjustment for an analog YPbPr signal, suitable for calculating and setting the gain of an ADC, wherein the ADC receives and converts the analog YPbPr signal, the method comprising:
calculating and setting the gain according to an actual horizontal synchronization peak-to-peak voltage of a horizontal synchronization signal of a Y signal of the analog YPbPr signal.

13. The method for gain adjustment for the analog YPbPr signal as claimed in claim 12, wherein the ADC receives the gain with a register contained within the ADC.

14. The method for gain adjustment for the analog YPbPr signal as claimed in claim 12, wherein the ADC satisfies the relation of $M=A+B*(G/2R)$, wherein M is an input voltage corresponding to the maximum output value of the ADC, A is a first predetermined voltage, B is a second predetermined voltage, G is the gain, and R is the number of bits of the ADC.

15. The method for gain adjustment for the analog YPbPr signal as claimed in claim 14, wherein the gain $G=((VD/VS)*X-A)/B*2R$, wherein VD is a standard data peak-to-peak voltage of a data signal of the Y signal, VS is a standard horizontal synchronization peak-to-peak voltage of the horizontal synchronization signal of the Y signal, and X is the actual horizontal synchronization peak-to-peak voltage of the horizontal synchronization signal.

16. The method for gain adjustment for the analog YPbPr signal as claimed in claim 12, further comprising:
filtering out the direct current (DC) component of the Y signal.

17. The method for gain adjustment for the analog YPbPr signal as claimed in claim 12, further comprising:
generating a compound synchronization signal according to the Y signal, wherein if the Y signal is greater than a reference voltage, the compound synchronization signal is at a first state; if the Y signal is smaller than the reference voltage, the compound synchronization signal is at a second state, and the method begins to calculate and set the gain for the ADC at an assigned edge of the compound synchronization signal.

18. The method for gain adjustment for the analog YPbPr signal as claimed in claim 17, wherein the first state is logic 1, the second state is logic 0, and the assigned edge of the compound synchronization signal is a rising edge.

19. The method for gain adjustment for the analog YPbPr signal as claimed in claim 17, wherein the first state is logic 0, the second state is logic 1, and the assigned edge of the compound synchronization signal is a falling edge.

20. The method for gain adjustment for the analog YPbPr signal as claimed in claim 12, further comprising:
clamping the Y signal to 0 V in a horizontal blanking period of the Y signal, wherein the ADC receives the clamped Y signal.

21. The method for gain adjustment for the analog YPbPr signal as claimed in claim 12, further comprising:
clamping the lowest potential of the horizontal synchronization signal to 0 V;
converting the clamped Y signal from an analog signal to a digital signal; and
calculating and setting the gain according to the digitalized actual horizontal synchronization peak-to-peak voltage.

22. The method for gain adjustment for the analog YPbPr signal as claimed in claim 21, wherein the step of clamping the lowest potential of the horizontal synchronization signal to 0 V is achieved at a first falling edge of the horizontal synchronization signal.

* * * * *